(12) United States Patent
Goss et al.

(10) Patent No.: US 8,963,566 B2
(45) Date of Patent: Feb. 24, 2015

(54) THERMALLY ADAPTIVE IN-SYSTEM ALLOCATION

(71) Applicant: International Business Machines Corporation, Armonk, NY (US)

(72) Inventors: John R. Goss, South Burlington, VT (US); Robert McMahon, Essex Junction, VT (US); Troy J. Perry, Georgia, VT (US)

(73) Assignee: Intenational Business Machines Corporation, Armonk, NY (US)

( * ) Notice: Subject to any disclaimer, the term of this patent is extended or adjusted under 35 U.S.C. 154(b) by 271 days.

(21) Appl. No.: 13/645,869

(22) Filed: Oct. 5, 2012

(65) Prior Publication Data

US 2014/0097860 A1  Apr. 10, 2014

(51) Int. Cl.
*G01R 31/00* (2006.01)

(52) U.S. Cl.
USPC ................................. 324/750.03; 324/750.15

(58) Field of Classification Search
None
See application file for complete search history.

(56) References Cited

U.S. PATENT DOCUMENTS

| | | | |
|---|---|---|---|
| 5,870,407 A | 2/1999 | Hsia et al. | |
| 6,097,647 A | 8/2000 | Zagar et al. | |
| 6,778,453 B2 | 8/2004 | Martin et al. | |
| 6,856,569 B2 | 2/2005 | Nelson et al. | |
| 7,113,422 B2 | 9/2006 | Theel | |
| 7,894,284 B2 | 2/2011 | Rodriguez et al. | |
| 8,045,415 B2 | 10/2011 | Janzen et al. | |
| 2008/0091988 A1* | 4/2008 | Yoel et al. | 714/711 |
| 2012/0230136 A1 | 9/2012 | Gorman et al. | |
| 2013/0173970 A1* | 7/2013 | Kleveland et al. | 714/710 |

OTHER PUBLICATIONS

IBM, "Method for Dynamic Test Binning of Semiconductors Containing Memory Arrays," IP.com No. IPCOM000181820D, Apr. 14, 2009, 5 pages.

IBM, "A Method and Circuit for Self Tuning of Setup and Hold Margins for Embedded Memory Devices," IP.com No. IPCOM000033399D, Dec. 9, 2004, 4 pages.

Taylor, et al., "A 1-Mbit CMOS Dynamic RAM with a Divided Bitline Matrix Architecture," Special Papers, IEEE Journal of Solid-State Circuits, vol. SC-20, No. 5, Oct. 1985, pp. 894-902.

* cited by examiner

*Primary Examiner* — Minh N Tang

(74) *Attorney, Agent, or Firm* — Gibb & Riley, LLC; David A. Cain, Esq.

(57) ABSTRACT

An integrated circuit device includes component devices (that include primary and alternate devices) and storage elements connected to the component devices. The storage elements store different sets of repair addresses indicating which of the primary devices and alternate devices are to be enabled. Further, a controller is connected to the storage elements, and a temperature sensor is connected to the controller. The temperature sensor senses the temperature. The controller selects one of the different storage elements to select at least one of the sets of repair addresses based on the temperature sensed by the temperature sensor. The sets of repair addresses share use of at least one of the alternate devices and at least one of the primary devices.

12 Claims, 4 Drawing Sheets

THERMALLY ADAPTIVE IN-SYSTEM ALLOCATION

BACKGROUND

The present disclosure relates to integrated circuit structures and more particularly to utilizing different sets of repair addresses within storage elements to selectively enable and disable various components of the integrated circuit structures within different temperature ranges.

Modern integrated circuit structures include many different individual components. Some of these components can operate better at certain temperatures, while other components may operate better at different temperatures. Further, some components can be redundant of other components allowing certain components to be used in place of other components if or when the device is operating within a certain temperature environment, or if some of the components are defective.

One device that is commonly used to selectively engage or disengage a specific component from operating in the integrated circuit device is storage element, such as a register, an electronic fuse (eFuse), etc., that stores addresses of which components are to be utilized.

When devices are tested, various operating parameters can be determined. For example, one operating parameter is the maximum (or minimum) operating temperature range, outside of which the components of the integrated circuit device cannot reliably operate. In addition, such testing can determine that certain components will operate better at a certain temperature, while other components may operate better at different temperatures. This allows the fuses to program an integrated circuit device to operate optimally at a specific temperature.

SUMMARY

According to one exemplary embodiment herein, an integrated circuit device comprises component devices (that include primary and alternate devices) and storage elements connected to the component devices. The storage elements store different sets of repair addresses indicating which of the primary devices and alternate devices are to be enabled. Further, a controller is connected to the storage elements, and a temperature sensor is connected to the controller. The temperature sensor senses the temperature. The controller selects at least one of the different storage elements to select at least one of the sets of repair addresses based on the temperature sensed by the temperature sensor. The sets of repair addresses share use of at least one of the alternate devices and at least one of the primary devices.

According to one exemplary embodiment herein, an integrated circuit device comprises component devices (that include primary and alternate devices) and storage elements connected to the component devices. The storage elements store different sets of repair addresses indicating which of the primary devices and alternate devices are to be enabled. Further, a controller is connected to the storage elements, and a temperature sensor is connected to the controller. The temperature sensor senses the temperature. Alternatively, the temperature input comes from an offchip temperature sensor or from a register that stores temperature. The controller selects at least two of the different storage elements to select at least two of the sets of repair addresses based on the temperature sensed by the temperature sensor. The sets of repair addresses share use of at least one of the alternate devices and at least one of the primary devices.

An exemplary method embodiment herein tests component devices of the integrated circuit device for operating performance at different temperatures. The component devices include primary devices and alternate devices. The method establishes different sets of repair addresses indicating which of the primary devices and alternate devices are to be enabled at different temperatures. Each of the different sets of repair addresses uses masking to ignore repairs made in other ones of the sets of repair addresses. Repair masking allows one or more repair steps to be suppressed through a simple instruction. Having this masking capability actually allows the number of repair passes to be increased quite easily if additional test temperature passes were in plan for a given part, because once masked the alternate devices used in a previous repair step are available once again for the present repair.

Another method embodiment herein tests component devices of the integrated circuit device for operating performance at different temperatures. The component devices include primary devices and alternate devices. The method establishes different sets of repair addresses indicating which of the primary devices and alternate devices are to be enabled at different temperatures based on the testing. Each of the different sets of repair addresses uses masking to ignore repairs made in other ones of the sets of repair addresses. The method also stores the different sets of repair addresses in storage elements operatively connected to a controller and senses a temperature of the integrated circuit using a temperature sensor operatively connected to the controller. Alternatively, the temperature input comes from an offchip temperature sensor or from a register that stores temperature. Further, the method selects at least two of the storage elements using the controller based on the temperature of the integrated circuit device. The different sets of repair addresses share use of at least one of the alternate devices and at least one of the primary devices.

BRIEF DESCRIPTION OF THE DRAWINGS

The embodiments herein will be better understood from the following detailed description with reference to the drawings, which are not necessarily drawn to scale and in which.

DETAILED DESCRIPTION

Figure 1:
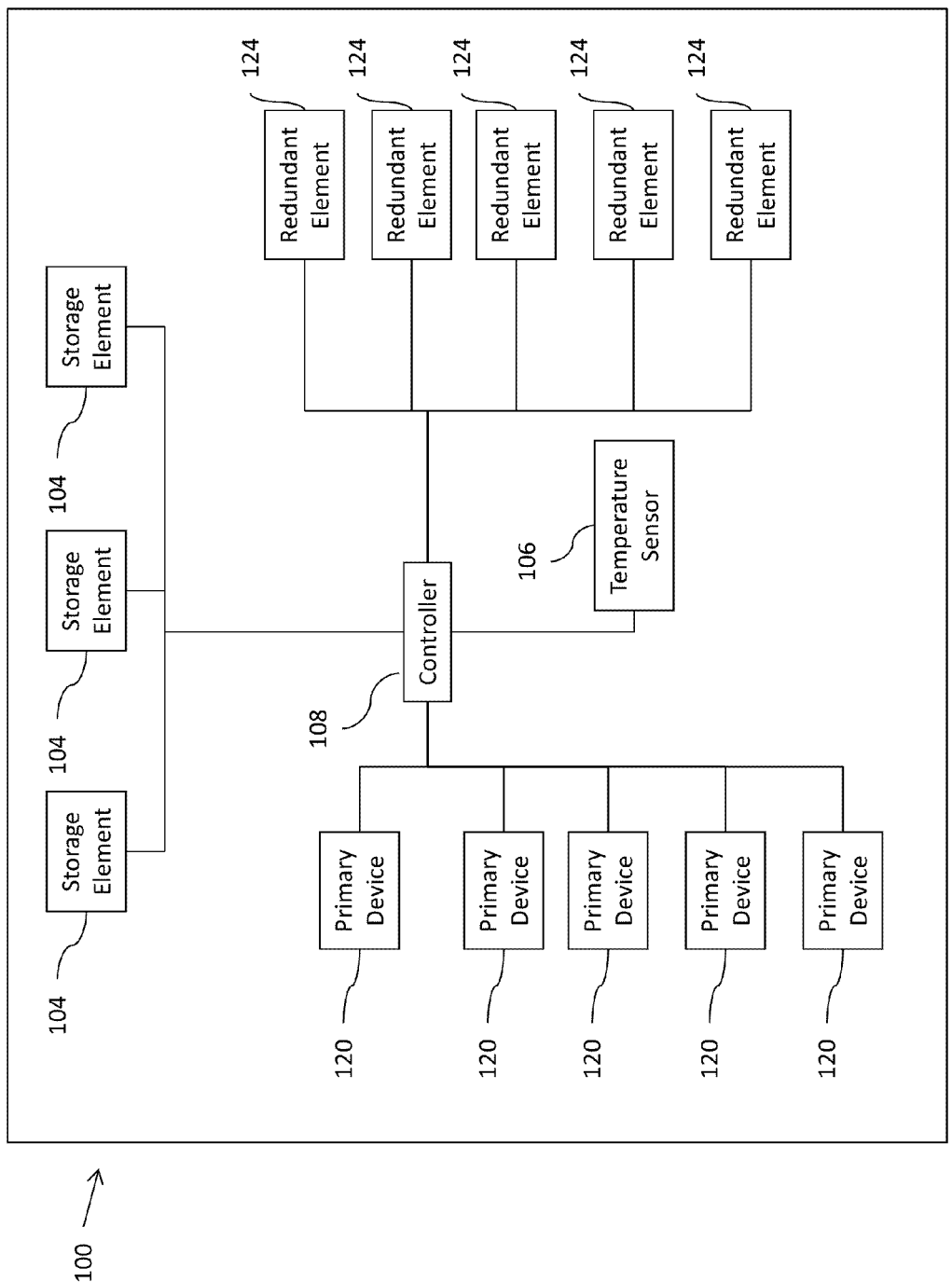
FIG. 1 is a schematic diagram illustrating embodiments herein.

As mentioned above, fuses can be used to selectively engage or disengage components such as alternate memory elements from operating within an integrated circuit device. There are practical limitations to the amount of alternate memory elements available to memories while simultaneously providing functionality over a wide temperature range. These limitations are realized in the form of profit (yield), and performance (overhead of implementing unnecessary redundancy solutions for a given condition).

The systems and methods herein tailor multiple sets of repair addresses to satisfy various temperature ranges, using a subset of the entire temperature range solution at a given time. Thus, the embodiments herein provide a high temperature repair solution that is stored in electronic fuses, and then a low temperature repair solution that is also stored in electronic fuses. Which solution to use will be dynamically controlled based upon temperature.

More specifically, the systems and methods herein utilize test and repair flows to collect and store redundancy solutions, which can also be referred to as "optimized configurations." With the systems and methods herein, the redundancy that is used to comprise solution number 1 (i.e., 85° C. solution) is later ignored when accumulating solution number 2 (i.e., 10° C. solution), which allows previously "used" redundant elements of solution number 1 to be reused in solution number 2.

Because there are two or more solutions provided by the systems and methods herein, one and only one is selected. This is accomplished through the use of repair masking. Repair masking allows one or more repair steps to be suppressed through a simple instruction. While repair masking is mentioned as one option herein, multiple passes can be combined in any way that would be useful, and repair masking is not needed for a processor. Having this masking capability actually allows the number of repair passes to be increased quite easily if additional test temperature passes were in plan for a given part. In addition to more, combinations of multiple passes, the systems and methods herein also allow for greater product yield across the entire temperature range. This increases yield by reducing the number of component devices that are rejected. More specifically, by finding that a given component device operates properly within a limited temperature range, this component part can be used in that limited temperature range and not scrapped. To the contrary, if all component devices are required to successfully operate across all desired temperature ranges, such limited temperature range component devices would be scrapped. By not scrapping and keeping more devices, yield is improved and the flexibility of the overall device to operate in different temperature ranges is improved.

Further, the systems and methods herein can dynamically operate in the field by utilizing onboard circuits to detect the ambient temperature (current room temperature) or the temperature of any portion of the integrated circuit device, and to select the most appropriate set of repair addresses dynamically based upon predetermined set-points. This is accomplished, in one example, by using an embedded sensor to monitor environmental conditions. Alternatively, the temperature input comes from an offchip temperature sensor or from a register that stores temperature.

More specifically, as shown in FIG. 1, an integrated circuit device 100 comprises component devices (which includes primary 120 and redundant elements 124) and storage elements 104 connected to the component devices 120. The component devices 120 can be any electrical device including memory cells, processors, logic devices, power supplies, arrays of devices, etc.

The storage elements 104 selectively enable and disable each of the component devices 120 by maintaining at least one set of repair addresses. The storage elements 104 can be any devices that can store a set of repair addresses including eFuses, registers, flip-flops, memory cells, non-transitory storage mediums, etc. Each of the different sets of repair addresses comprises a list of primary and alternative components that are to be enabled, and each set of repair addresses is useful in a single temperature range, indicating which devices will operate within a given temperature range. Therefore, within a certain temperature range certain primary devices will be disabled, and alternative devices will be enabled in place of the disabled primary devices. Thus, each storage element 104 maintains addresses of the component devices (both primary 120 and redundant elements 124) that are to be used in a specific repair solution that is optimized for a specific temperature range (optimized configuration).

A controller 108 is similarly connected to the storage elements 104, and a temperature sensor 106 is connected to the controller 108. The temperature sensor 106 senses the temperature 120 if the integrated circuit device itself, or a temperature of the environment in which the integrated circuit device 100 is presently in (ambient temperature). Alternatively, the temperature input comes from an offchip temperature sensor or from a register that stores temperature.

The controller 108 selects one or more of the storage elements 104 depending upon the temperature sensed by the temperature sensor 106 based on the information in the memory. By selecting a storage element 104, the set or sets of repair addresses maintained by that storage element is selected (and the component devices 120 within that set of repair addresses are enabled). Selecting more than one storage element 104 selects more than one set of repair addresses. Thus, the controller 108 selectively enables a first set of repair addresses of primary 120 and redundant elements 124 when the temperature sensor 106 senses that the temperature 120 is within a first temperature range by selecting one or more storage elements 104. Selecting a different (or more) storage element(s) 104 selectively enables a second set of repair addresses.

Such sets of repair addresses of primary 120 are sometimes referred to as sets of "repair" addresses because the failing primary devices 120 are disengaged by the component addresses in the storage element, and alternate devices are engaged in their place by the component addresses in the storage element to "repair" the failing devices. Thus, redundant elements 124 are substituted for failing primary devices 120 in the integrated circuit device 100 (different primary devices 120 will fail at different temperatures) and each different storage element 104 maintains the addresses of primary 120 and redundant elements 124 that make up each set of repair addresses appropriate for each temperature range.

Each of the sets of repair addresses uses repair masking. Repair masking is a process that ignores repairs made in the other sets of repair addresses when establishing a test set of repair addresses for a given temperature. In other words, when performing repair masking, it is assumed that none of the primary devices 120 have been disengaged and that none of the redundant elements 124 have been engaged and that all are available for use. Thus, the systems herein individually establish a set of repair addresses for each test temperature independently of any repairs made for different test temperatures. The controller 108 also changes which storage element(s) is/are selected to selectively enable different ones of primary devices 120 and redundant elements 124, based on the temperature. Because of masking, the different sets of repair addresses share use of at least one of the redundant elements 124 and at least one of the primary devices 120.

Each of the sets of repair addresses was determined at a different test temperature and is for use in a different temperature range; however, multiple sets of repair addresses can be combined and used within a larger temperature range that spans both of the individual temperature ranges. For example, testing may have been done at five different temperatures, producing five sets of repair addresses, each set of repair addresses having a specific useful temperature range. In one example, the top two temperature ranges (ranges 1 and 2, where range 1 could be a higher temperature than range 2) could be combined into a single larger temperature range that spans the temperature from the low temperature of temperature range 2 to the high temperature of temperature range 1. Temperature ranges 1 and 2 could be overlapping ranges or adjacent temperature ranges. Any temperatures within this larger temperature range would have the storage elements simultaneously apply both sets of repair addresses of primary and alternate devices of temperature range 1 and temperature range 2 simultaneously.

Further, each of the different temperature ranges comprises a subset of the maximum (or minimum) operating temperature range of the component devices. None of the component devices are able to reliably operate outside the maximum (or minimum) operating temperature range.

Figures 2, 3:
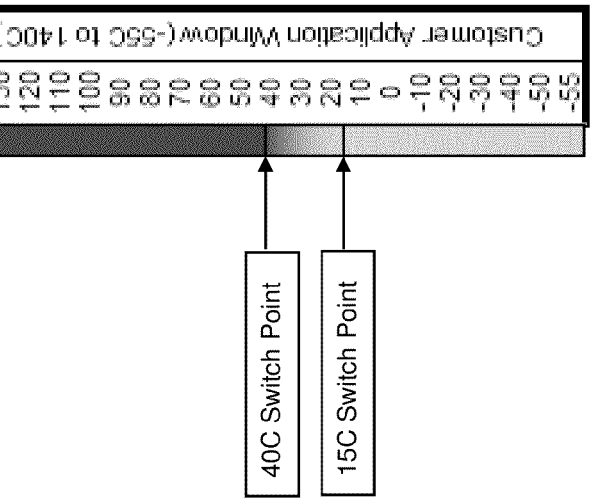
FIG. 2 is a chart illustrating the various embodiments herein.
FIG. 3 is a chart illustrating the various embodiments herein.

FIG. 2 illustrates an example of different ranges determined using, for example, four passes. For example, in test pass 1, the first (need to substitute a alternate component) testing was performed at 85° C., the second testing was performed at 50° C., the third testing at 25° C., and the fourth testing at −10° C. If single sets of repair addresses are used, the ranges could be, for example, 1) 60° C.-140° C.; 2) 40° C.-60° C.; 3) 15° C.-40° C.; and 4) −55° C.-15° C.

However, if these single sets of repair addresses are combined by being used simultaneously, the three temperature ranges (high, medium, and low) can be used. Therefore, at any given application temperature, two passes can be invoked using masking, and this approach allows for three customer operating conditions as shown on the right side of the chart in FIG. 2. More specifically, the three customer operating conditions (operating temperature ranges) include a high temperature range application of 40° C. to 140° C. (which includes both 1 and 2 (60° C.-140° C. and 40° C.-60° C.); a medium temperature range application of 15° C. to 40° C. which includes both 2 and 3 (40° C.-60° C. and 15° C.-40° C.); and a low temperature range application of −55° C. to 15° C. which includes both 3 and 4 (15° C.-40° C. and −55° C.-15° C.). As shown in FIG. 2, this allows the repairs to overlap across the temperature range (i.e., the high and low temperature repairs have a single switch point, avoiding midpoint exposure). As shown in FIG. 3, the thermal sensor logic includes two switch points (15° C. and 40° C.) to switch into and out of the middle temperature range.

Thus, each of the bounding temperature ranges (high, low) comprises a subset of the maximum (or minimum) operating temperature range (−55° C. to 140° C.) of the component devices, and none of the component devices are able to reliably operate outside this maximum (or minimum) operating temperature range.

Figure 4:
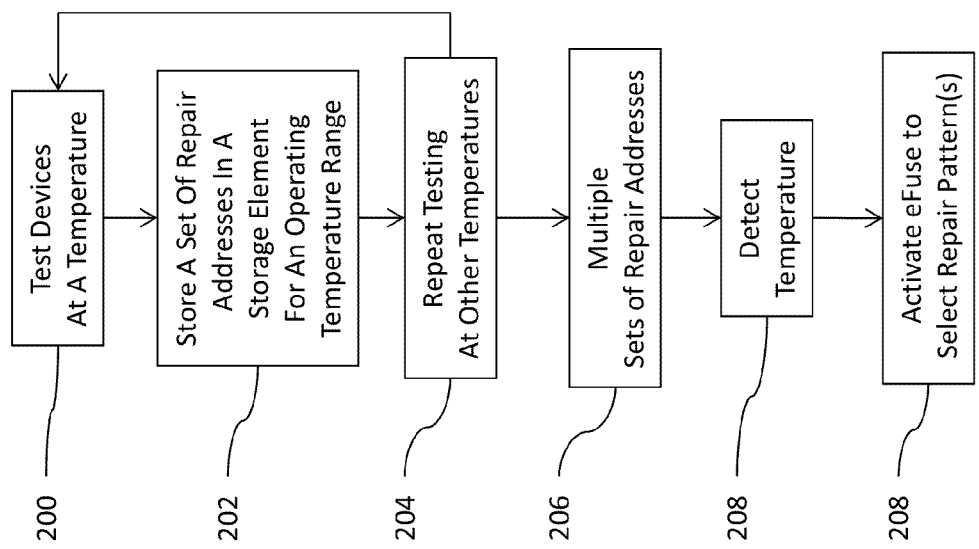
FIG. 4 is a flow diagram illustrating embodiments herein.

FIG. 4 is a flowchart illustrating various method operations herein. In item 200, this exemplary method begins by testing an integrated circuit device. Item 200 tests component devices of the integrated circuit device for operating performance at a first test temperature. In item 202, this method stores a set of repair addresses in one of the storage elements to selectively enable a first group of the component devices to operate when the component devices are within a first temperature range. In item 204, the process loops back to test for different sets of repair addresses at different temperature ranges.

Therefore, in items 200-204, the method tests component devices of the integrated circuit device for operating performance at different temperatures and establishes different sets of repair addresses stored in different storage elements. Each of the sets of repair addresses in item 206 uses masking to ignore repairs made in the other sets of repair addresses. Thus, in items 200-204, this method individually establishes a set of repair addresses for each test temperature independently of any repairs made for different test temperatures.

When the integrated circuit device is in use by the customer, such a method also automatically detects the temperature in item 208. In item 210, the method continuously and dynamically selects different storage elements to selectively enable different ones of the component devices. The sets of repair addresses share use of at least one of the redundant elements 124 and at least one of the primary devices 120.

Figure 5:
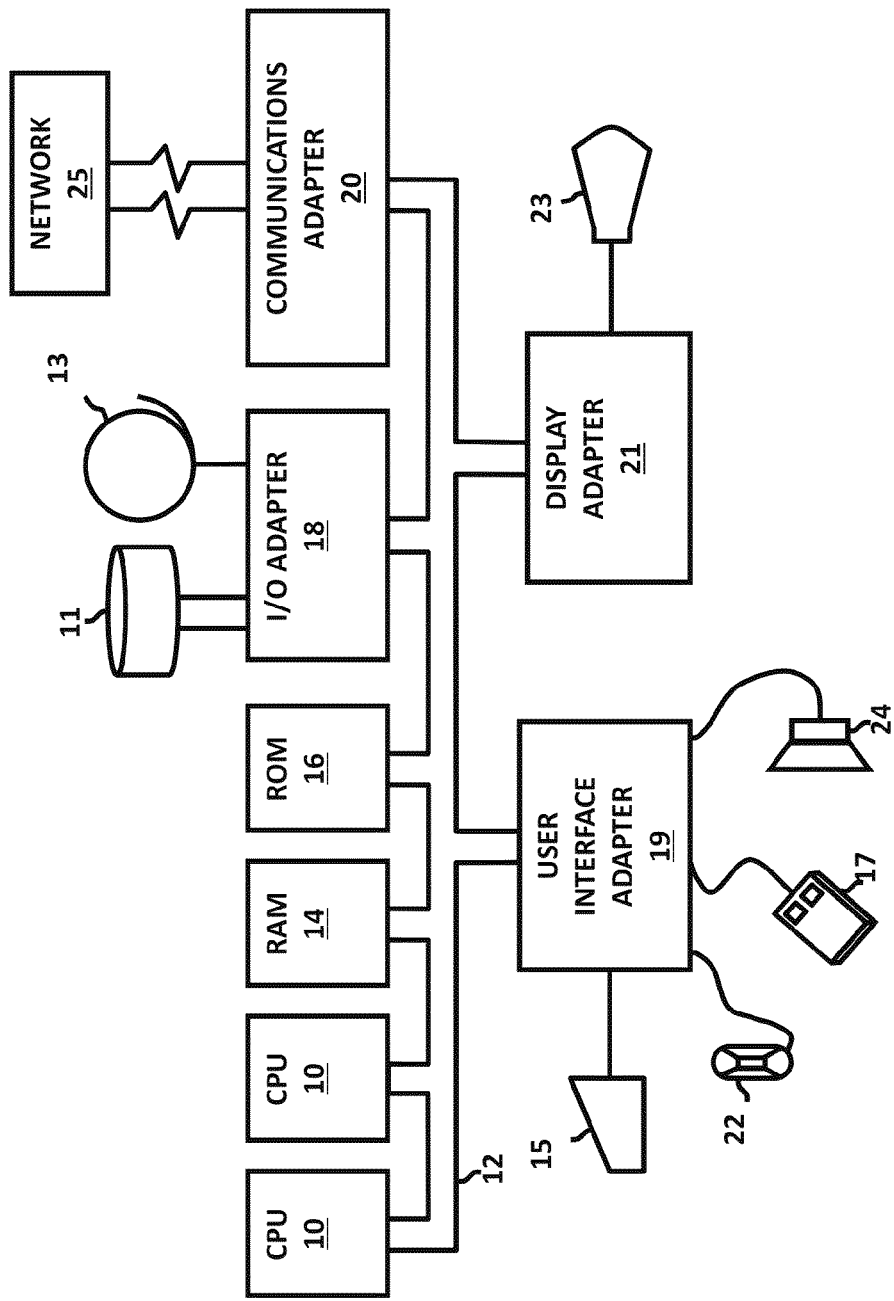
FIG. 5 is a schematic diagram of a hardware system according to embodiments herein.

A representative hardware environment for practicing the embodiments herein is depicted in FIG. 5. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

The flowchart and block diagrams in the Figures illustrate the architecture, functionality, and possible implementations of systems, methods and computer program products according to various embodiments herein. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of this disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit device comprising:
    component devices, said component devices comprising primary devices and alternate devices;
    a controller operatively connected to said component devices;
    storage elements operatively connected to said controller, said storage elements storing different sets of repair addresses indicating which of said primary devices and alternate devices are to be enabled; and
    a temperature sensor operatively connected to said controller,
    said temperature sensor sensing a temperature of said integrated circuit device,
    said controller selecting different ones of said storage elements to select at least one of said different sets of repair addresses based on said temperature sensed by said temperature sensor, and
    said different sets of repair addresses sharing use of at least one of said alternate devices and at least one of said primary devices.

2. The integrated circuit device according to claim 1, further comprising a non-transitory storage medium operatively connected to said controller, said storage medium storing an identification of storage elements to select at different temperatures.

3. The integrated circuit device according to claim 1, each of said sets of repair addresses being for a different temperature range.

4. The integrated circuit device according to claim 3, each said different temperature range comprising a subset of a maximum (or minimum) operating temperature range of said component devices,
    none of said component devices being able to operate outside said maximum (or minimum) operating temperature range.

5. The integrated circuit device according to claim 1, said storage elements comprising registers storing addresses of said component devices.

6. The integrated circuit device according to claim 1, each of said sets of repair addresses using masking to ignore repairs made in other ones of said sets of repair addresses.

7. A method of testing an integrated circuit device comprising:
    testing component devices of said integrated circuit device for operating performance at different temperatures, said component devices comprising primary devices and alternate devices;
    establishing different sets of repair addresses indicating which of said primary devices and alternate devices are to be enabled at different temperatures based on said testing, each of said different sets of repair addresses using masking to ignore repairs made in other ones of said sets of repair addresses;
    storing said different sets of repair addresses in storage elements operatively connected to a controller;
    sensing a temperature of said integrated circuit using a temperature sensor operatively connected to said controller; and
    selecting at least one of said storage elements using said controller based on said temperature of said integrated circuit device,
    said different sets of repair addresses sharing use of at least one of said alternate devices and at least one of said primary devices.

8. The method according to claim 7, further comprising storing an identification of storage elements to select at different temperatures in a non-transitory storage medium operatively connected to said controller.

9. The method according to claim 7, each of said sets of repair addresses being for a different temperature range.

10. The method according to claim 9, each said different temperature range comprising a subset of a maximum (or minimum) operating temperature range of said component devices,
    none of said component devices being able to operate outside said maximum (or minimum) operating temperature range.

11. The method according to claim 7, said storage elements comprising registers storing addresses of said component devices.

12. The method according to claim 7, said establishing of said sets of repair addresses comprising individually establishing a set of repair addresses for each test temperature independently of any repairs made for different test temperatures.

* * * * *